(12) United States Patent
Ji et al.

(10) Patent No.: US 11,136,670 B2
(45) Date of Patent: Oct. 5, 2021

(54) GAS SPRAYING APPARATUS, SUBSTRATE PROCESSING FACILITY INCLUDING THE SAME, AND METHOD FOR PROCESSING SUBSTRATE USING SUBSTRATE PROCESSING FACILITY

(71) Applicant: AP SYSTEMS INC., Hwaseong-Si (KR)

(72) Inventors: Sang Hyun Ji, Yongin-Si (KR); Chang Kyo Kim, Hwaseong-Si (KR)

(73) Assignee: AP SYSTEMS INC.

( * ) Notice: Subject to any disclaimer, the term of this patent is extended or adjusted under 35 U.S.C. 154(b) by 548 days.

(21) Appl. No.: 15/870,756

(22) Filed: Jan. 12, 2018

(65) Prior Publication Data

US 2018/0258534 A1 Sep. 13, 2018

(30) Foreign Application Priority Data

Mar. 7, 2017 (KR) ........................ 10-2017-0029001

(51) Int. Cl.
*C23C 16/455* (2006.01)
*C23C 16/52* (2006.01)
*C23C 16/40* (2006.01)

(52) U.S. Cl.
CPC ........ *C23C 16/52* (2013.01); *C23C 16/45574* (2013.01); *C23C 16/402* (2013.01)

(58) Field of Classification Search
CPC ........ C23C 16/45563; C23C 16/45574; C23C 16/4585
USPC ........................................................ 118/728
See application file for complete search history.

(56) References Cited

U.S. PATENT DOCUMENTS 5,269,847 A * 12/1993 Anderson ............. C23C 16/455
    118/715
2006/0054088 A1* 3/2006 Jagawa .................. C23C 16/52
    118/715
2007/0281084 A1* 12/2007 Hirosawa .......... C23C 16/45565
    427/248.1

FOREIGN PATENT DOCUMENTS

| JP | 2005109303 A | 4/2005 |
| JP | 2006086177 A | 3/2006 |
| JP | 2007324286 A | 12/2007 |
| KR | 20120108094 A | 10/2012 |
| KR | 20160044102 A | 4/2016 |
| KR | 20160122523 A | 10/2016 |

* cited by examiner

*Primary Examiner* — Elizabeth A Burkhart
(74) *Attorney, Agent, or Firm* — Renaissance IP Law Group LLP

(57) ABSTRACT

A gas spraying apparatus according to the embodiment of the present invention includes a spray part disposed and aligned on one side outside a substrate in the width direction of the substrate, and having a plurality of nozzles for spraying gas toward the substrate, and a spray control unit for automatically controlling whether or not each of a plurality of nozzles sprays gas such that a gas density distribution type in the width direction of the substrate becomes a targeted gas density distribution type by the gas sprayed through the plurality of nozzles. Therefore, according to the embodiment of the present invention, it is easy to carry out the process with a plurality of types of process types or a plurality of types of gas density distribution types, and a time for adjusting the open or close operation of the plurality of nozzles can be shortened.

6 Claims, 13 Drawing Sheets

200 : 210, 211, 220, 230, 240a, 240b
6160 : 6161, 6162
6150 : 6151, 6153, 6154

(a)

(b)

GAS SPRAYING APPARATUS, SUBSTRATE PROCESSING FACILITY INCLUDING THE SAME, AND METHOD FOR PROCESSING SUBSTRATE USING SUBSTRATE PROCESSING FACILITY

CROSS-REFERENCE TO RELATED APPLICATION

This application claims priority to Korean Patent Application No. 10-2017-0029001 filed on Mar. 7, 2017 and all the benefits accruing therefrom under 35 U.S.C. § 119, the contents of which are incorporated by reference in their entirety.

BACKGROUND

The present disclosure relates to a gas spraying apparatus, a substrate processing facility including the apparatus, and a method for processing a substrate using the facility, and more particularly, to a gas spraying apparatus capable of easily controlling the distribution of gas density on a substrate, a substrate processing facility including the apparatus, and a method for processing a substrate using the facility.

A substrate processing apparatus for processing a substrate by using a process gas generally includes a chamber having an internal space, a stage disposed in the chamber and seating the substrate on an upper portion thereof, a light emitting unit positioned facing an upper side of the stage and emitting light to perform heat treatment for the substrate seated on the stage, and a plurality of nozzles aligned and disposed in one direction so as to correspond to an extension direction of the substrate and spraying gas toward the substrate from the upper side of the stage.

Meanwhile, according to a substrate processing process to be performed, the gas density distribution from the upper side of the substrate in the extension direction of the substrate may be different. For example, the gas density in an edge region of the substrate may be lower than that in a central region thereof, or on the contrary, the edge of the substrate may have a gas density higher than the central region thereof. In order to control such a distribution of gas density, some of a plurality of nozzles should be turned ON so as to spray gas, and some should be OFF so as not to spray gas.

However, in related art, there is a problem in that process switching efficiency and productivity are lowered due to manual ON and OFF controls of each of a plurality of nozzles, according to a process type to be processed.

PRIOR ART DOCUMENT

Patent Literature (Patent Document 1) Korea Patent Publication No. 10-2016-0122523

SUMMARY

The present disclosure provides a gas spraying apparatus capable of easily controlling the distribution of gas density, a substrate processing facility including the apparatus, and a method for processing a substrate using the facility.

In accordance with an exemplary embodiment, a gas spraying apparatus includes: a spray part aligned and disposed on one side outside a substrate in a width direction of the substrate, and having a plurality of nozzles spraying gas toward the substrate; a spray control unit configured to automatically control whether or not each of the plurality of nozzles sprays gas such that the distribution of gas density in the width direction of the substrate becomes the targeted distribution of gas density by the gas sprayed through the plurality of nozzles.

The spray control unit may include a gas density distribution type storage part configured to store different gas density distribution types; a spray type storage part configured to store a plurality of spray control types capable of realizing each of the plurality of gas density distribution types; and a spray control part, according to a substrate process to be performed, configured to select one of the gas density distribution type in the gas density distribution type storage part, and to select one spray control type in the spray type storage part such that the selected gas density distribution type is realized, and to control the operation of the spray part to control such that the spray part becomes the selected spray control type.

The spray control unit may include a process type storage part storing a plurality of different process types, and the spray control part may select any one of process types in the process type storage part and may select any one of gas density distribution types in the gas density distribution type storage part such that the selected process type is performed.

The spray part may include a spray block disposed on one side outside the substrate, formed by extending in the width direction of the substrate, and having the plurality of nozzles therein; a plurality of supply pipes configured to supply gas to each of the plurality of nozzles; and a spray valve seated on each of the plurality of supply pipes to control communication between the supply pipes and the nozzles, and the amount of gas.

The spray control part may interlock with the spray valve to control the operation of each of the plurality of spray valves according to the selected spray control type.

The gas spraying apparatus may further include a transport part configured to transport gas to each of the plurality of supply pipes; a case disposed so as to accommodate at least a part of the transport part in at least one position of an extension path of the transport part; a sensor is seated on the case to sense the gas inside the case, and thus monitors whether or not the gas is leak from the transport part.

In accordance with another exemplary embodiment, a substrate processing facility includes: a seating portion configured to seat a substrate on one surface; a heating unit faced with the seating portion to provide heat for heating the substrate; and a gas spraying apparatus, which is disposed on an upper surface of the seating portion and has a plurality of nozzles disposed so as to be positioned on one side outside the substrate seated on the seating portion to spray gas toward the substrate, and which automatically controls at least one of whether or not the gas is sprayed from each of the plurality of the nozzles and a gas spray amount of each at the plurality of nozzles.

The gas spraying apparatus may include: a spray part connected to the plurality of nozzles and each of the plurality of nozzles to have a plurality of valves configured to control at least one whether or not the gas is sprayed from each of the plurality of nozzles and a gas spray amount of each of the plurality of nozzles; a gas density distribution type storage part configured to store different gas density distribution types; a spray type storage part configured to store a plurality of spray control types capable of realizing each of the plurality of gas density distribution types; and a spray control part configured to select any one of gas density distribution types according to a substrate process to be performed in the gas density distribution storage part and to select one of spray control types from the spray type storage part such that the selected gas density distribution type is realized, and to control the operation of the spray part to control such that the spray part becomes the selected spay control type.

The spray part may include: a spray block disposed on one side outside the substrate, formed by extending in the width direction of the substrate, and having the plurality of nozzles therein; and a plurality of supply pipes connected to each of the plurality of nozzles to supply gas to each of the plurality of nozzles, wherein the plurality of spray valves are seated on each of the plurality of supply pipes, and the spray control part interlocks with the spray valves to control the operation of each of the plurality of spray valves according to the selected spray control type.

The substrate processing facility may further include: a transport part configured to transport the gas to each of the plurality of supply pipes; a case disposed so as to accommodate at least a part of the transport part in at least one position of an extension path of the transport part; a sensor seated on the case to sense the gas inside the case, and thus monitors a gas leakage from the transport part.

The seating portion may include: a stage seating the substrate on an upper surface thereof; and a cover member spaced apart from the upper side of the stage, and having an opening such that a substrate seated on the stage is exposed at least, wherein the spray part may be positioned on one side of the cover member from the upper side of the stage; an exhaust part may be disposed so as to face the spray block from the other outside of the seating portion to exhaust gas; a spacing space between one side of the stage and the cover member may be a gas supply passage through which the gas sprayed from the spray part is supplied in the direction in which the substrate is positioned; and a spacing space between the other side of the stage and the cover member may be a gas exhaust passage through which the gas passing through the upper side of the substrate is exhausted in the direction in which the exhaust part is positioned.

The heating unit may include a plurality of lamps positioned opposite to the upper side of the seating portion to be aligned in at least one direction, and emitting light.

The heating unit may include a window positioned between the plurality of lamps and the seating portion.

In accordance with yet exemplary embodiment, a method for processing a substrate includes: seating a substrate on a seating portion; and spraying the gas toward the substrate from a plurality of nozzles disposed on one side outside the substrate to treat the substrate, wherein the spraying the gas toward the substrate from the plurality of nozzles may control such that the gas density distribution in the width direction of the substrate becomes one of a plurality of gas density distribution types previously stored by the gas sprayed through the plurality of nozzles.

The spraying the gas toward the substrate from the plurality of nozzles may include: selecting a gas density distribution type corresponding with a process to treat the substrate among a plurality of gas density distribution types stored in a gas density distribution type storage part; selecting one of spray control types implementing the gas density distribution type selected from a plurality of spray control types stored in the spray control type storage part; and controlling at least one of whether or not the gas is sprayed from each of the plurality of nozzles and a gas spray amount of each of the plurality of nozzles such that the selected spray control type becomes.

The gas density distribution type storage part may store a plurality of gas density distribution types corresponding to each of a plurality of pressure conditions inside a chamber configured to treat the substrate; and the selecting a gas density distribution type corresponding with a process to treat the substrate may select any one of the plurality of gas density distribution types according to a pressure in the chamber to treat the substrate.

The method for processing a substrate may further include, while spraying gas toward the substrate, heating the substrate.

The heating the substrate may irradiate light toward the substrate.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
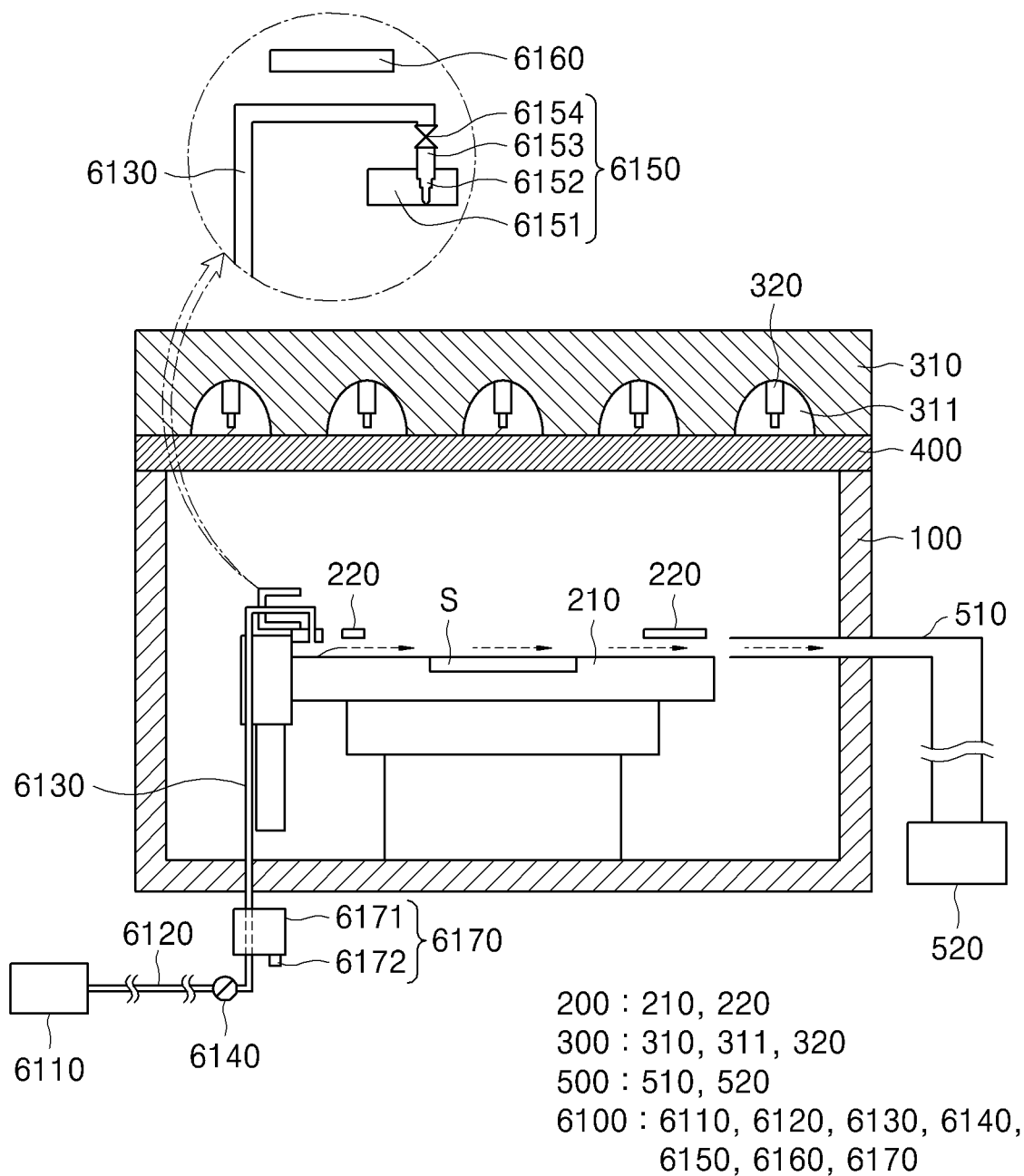
FIG. 1 is a view schematically illustrating a gas spraying apparatus and a substrate processing facility including the same, in accordance with an exemplary embodiment.
Figure 2:
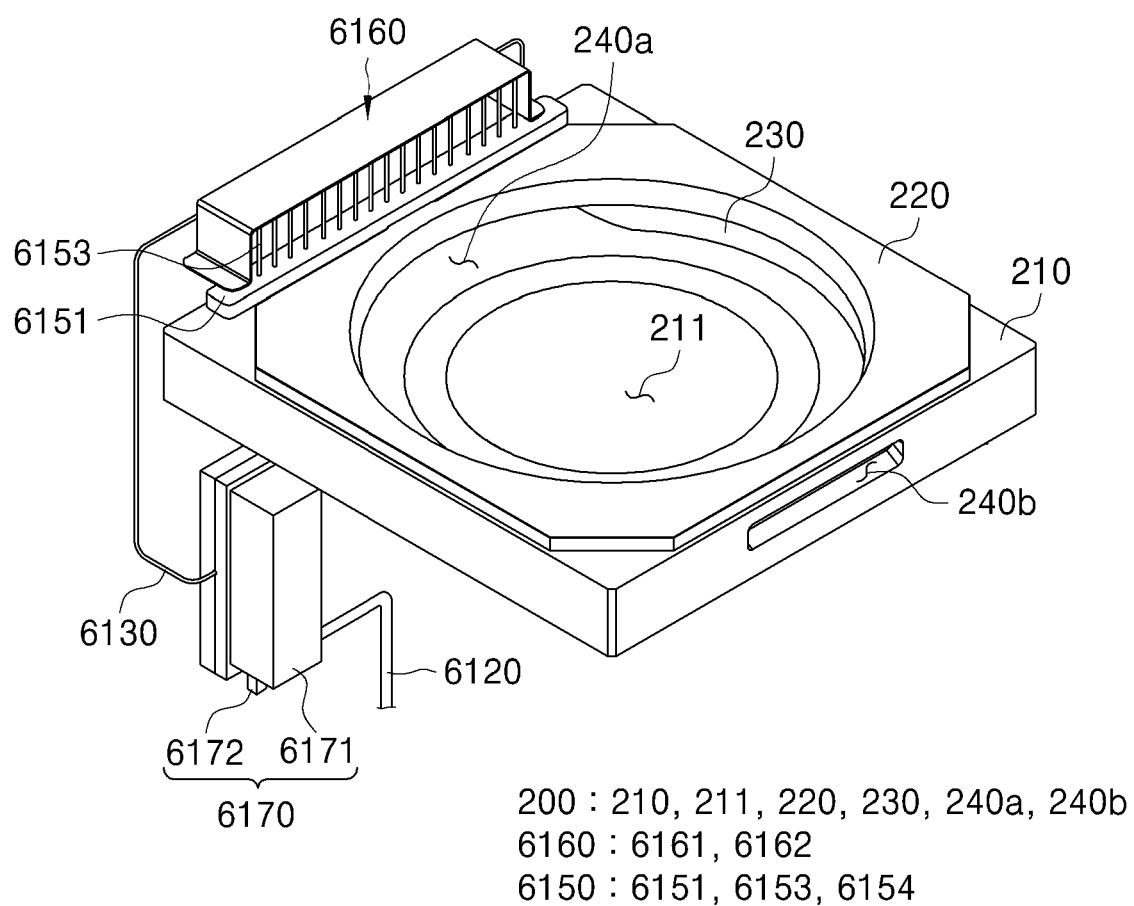
FIG. 2 is a stereoscopic view illustrating a seating portion and a spray part disposed on one side of the seating portion, in accordance with another exemplary embodiment.
Figure 3:
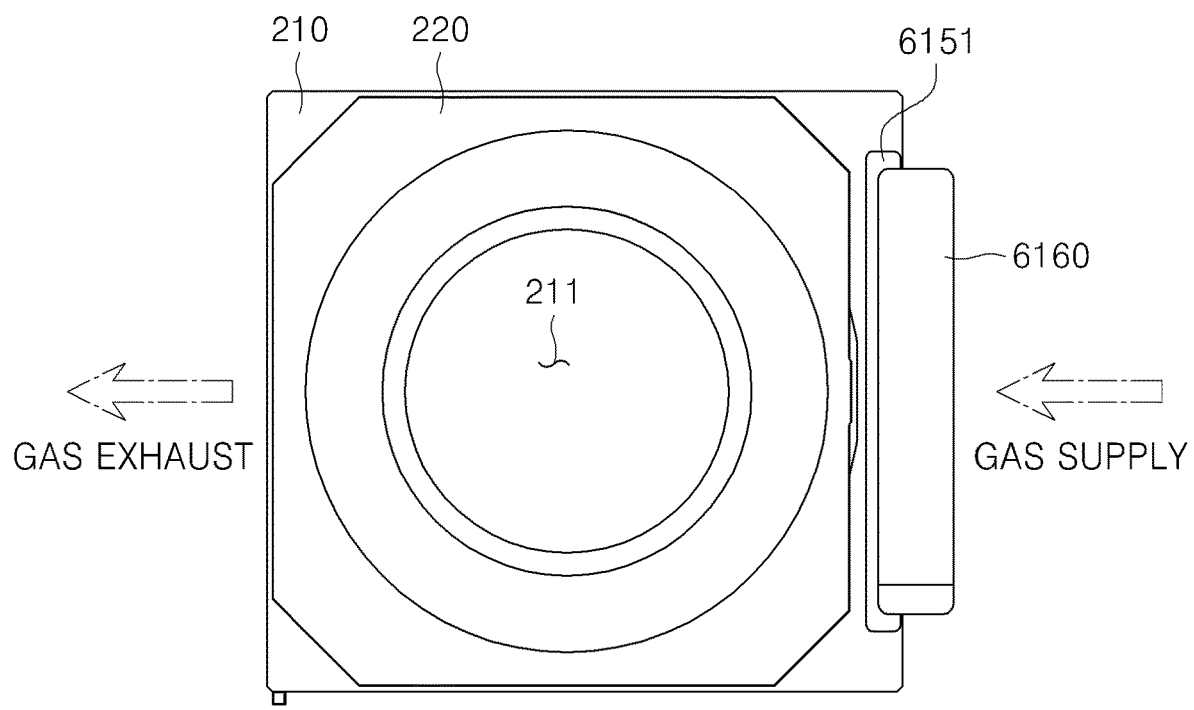
FIG. 3 is a top view of the seating portion, as viewed from an upper side, for describing the position of the spray part, in accordance with yet exemplary embodiment.
Figure 4:
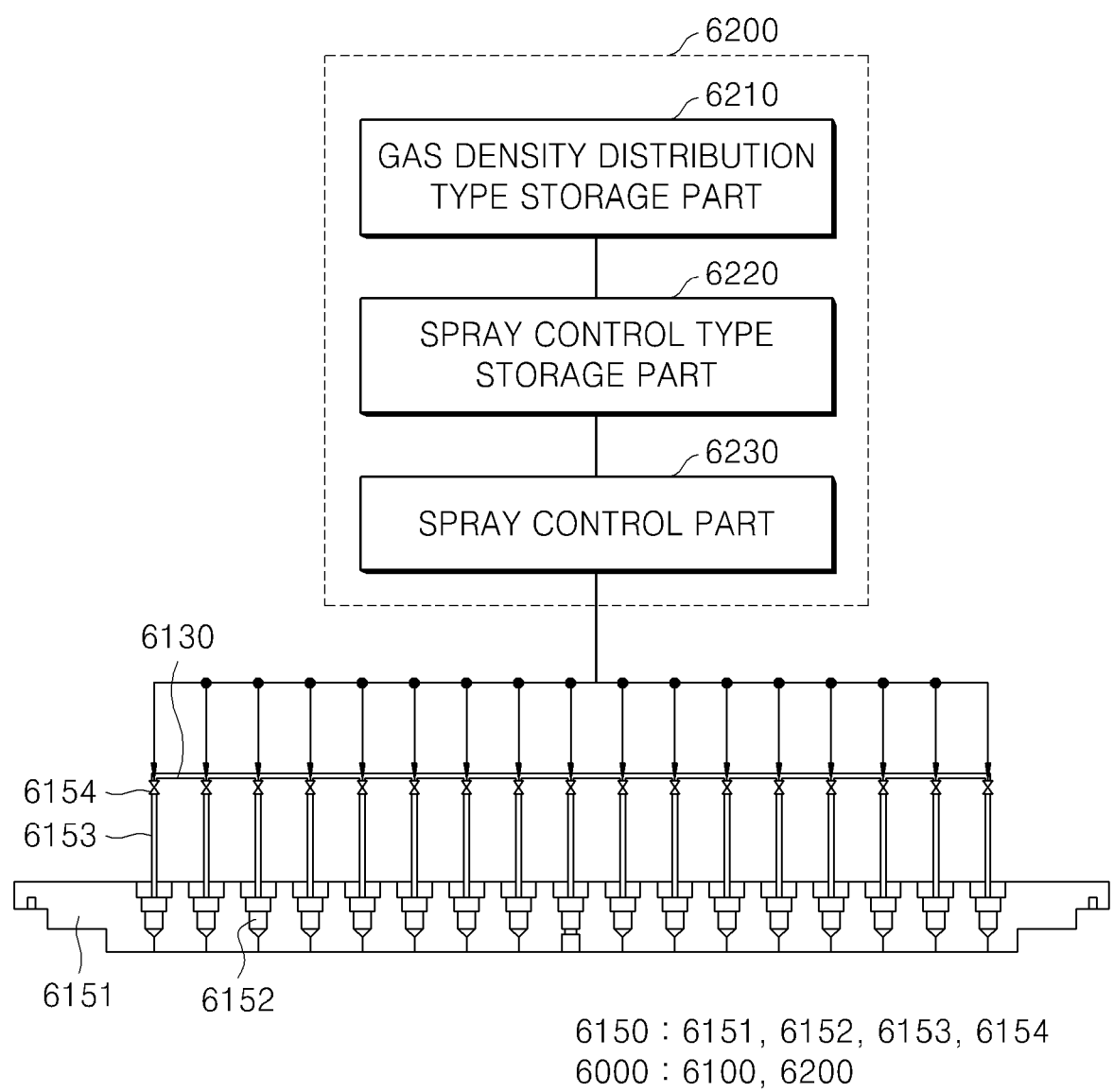
FIG. 4 is a view schematically illustrating the spray part and a spray control unit, in accordance with still exemplary embodiment.

FIG. 1 is a view schematically illustrating a gas spraying apparatus and a substrate processing facility including the same, in accordance with an exemplary embodiment. FIG. 2 is a stereoscopic view illustrating a seating portion and a spray part disposed on one side of the seating portion, in accordance with another exemplary embodiment. FIG. 3 is a top view of the seating portion, as viewed from an upper side, for describing the position of the spray part, in accordance with yet exemplary embodiment. FIG. 4 is a view schematically illustrating the spray part and a spray control unit, in accordance with still exemplary embodiment. FIG.

Figure 6:
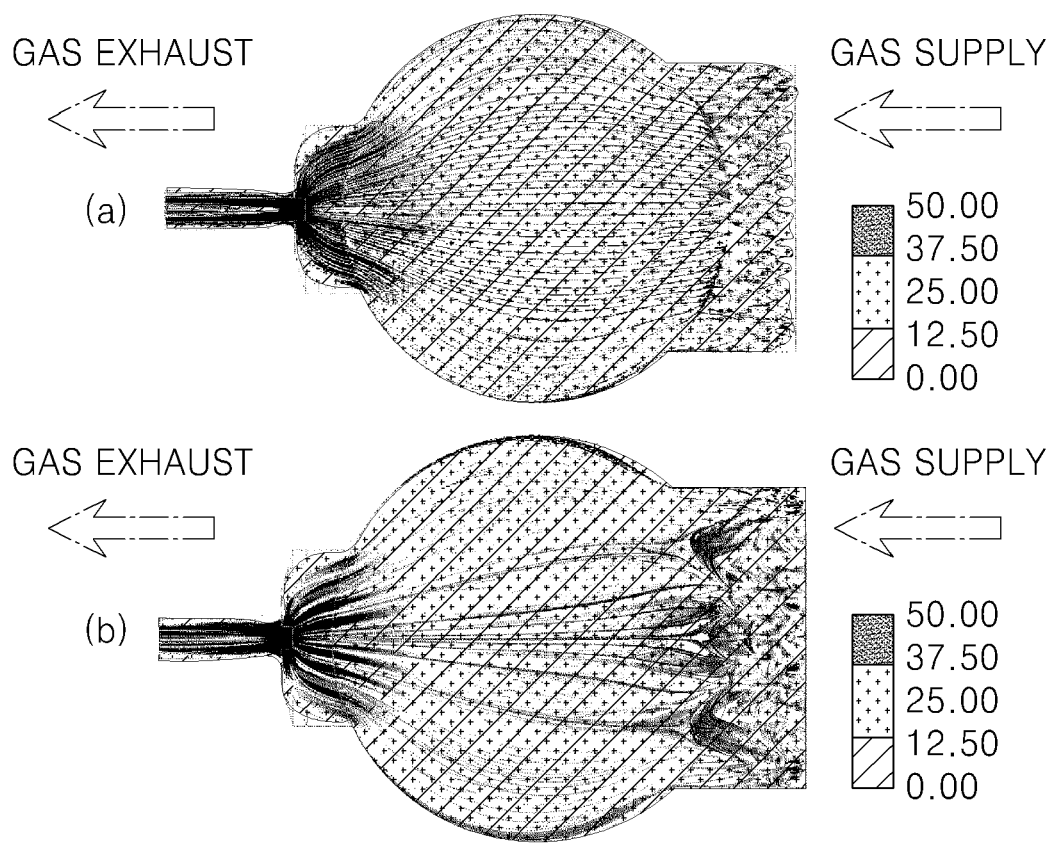
FIG. 6 is a view describing the flow of gas when the gas sprayed from the spray part flows toward an exhaust part.
Figure 7:
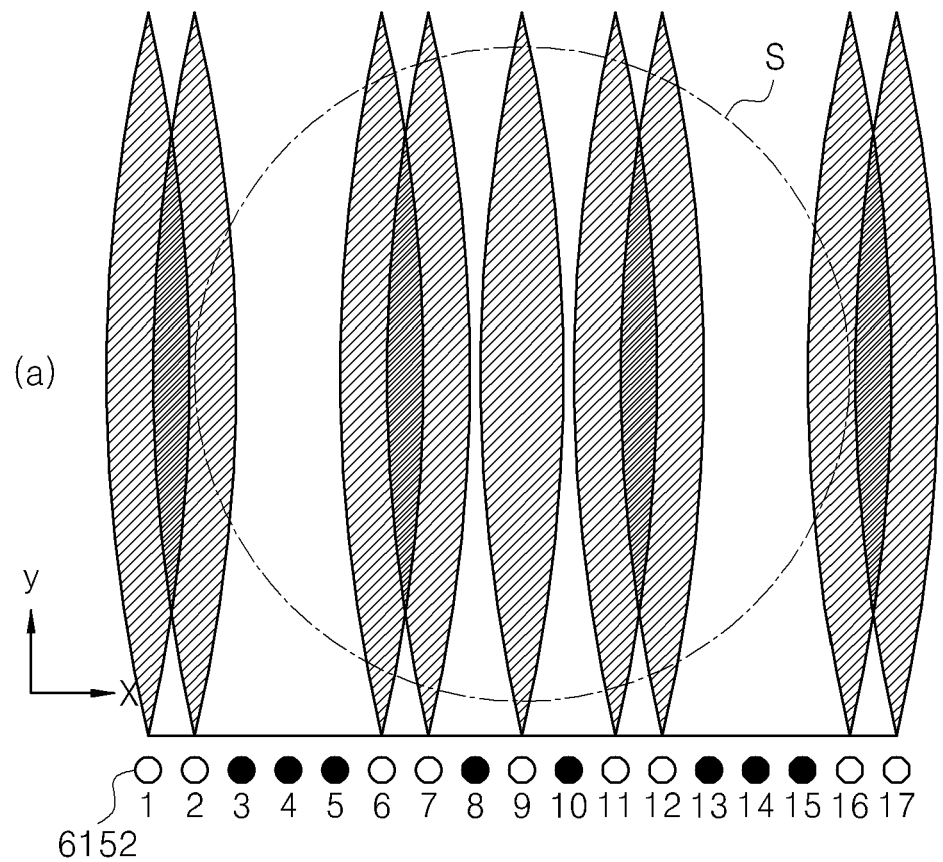
FIGS. 7 and 8 are views schematically illustrating the distribution of gas density according to whether or not each of a plurality of nozzles sprays gas, respectively.
Figure 7:
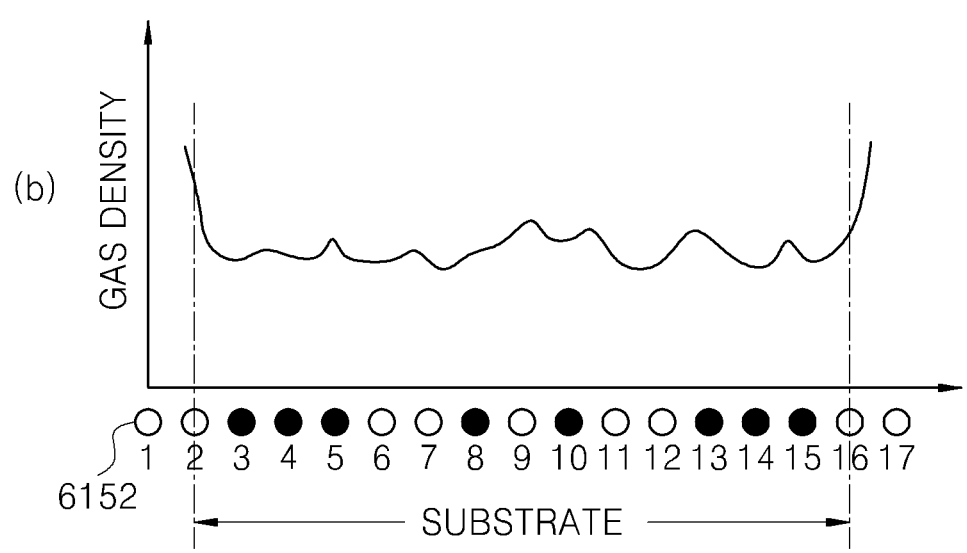
Figure 8:
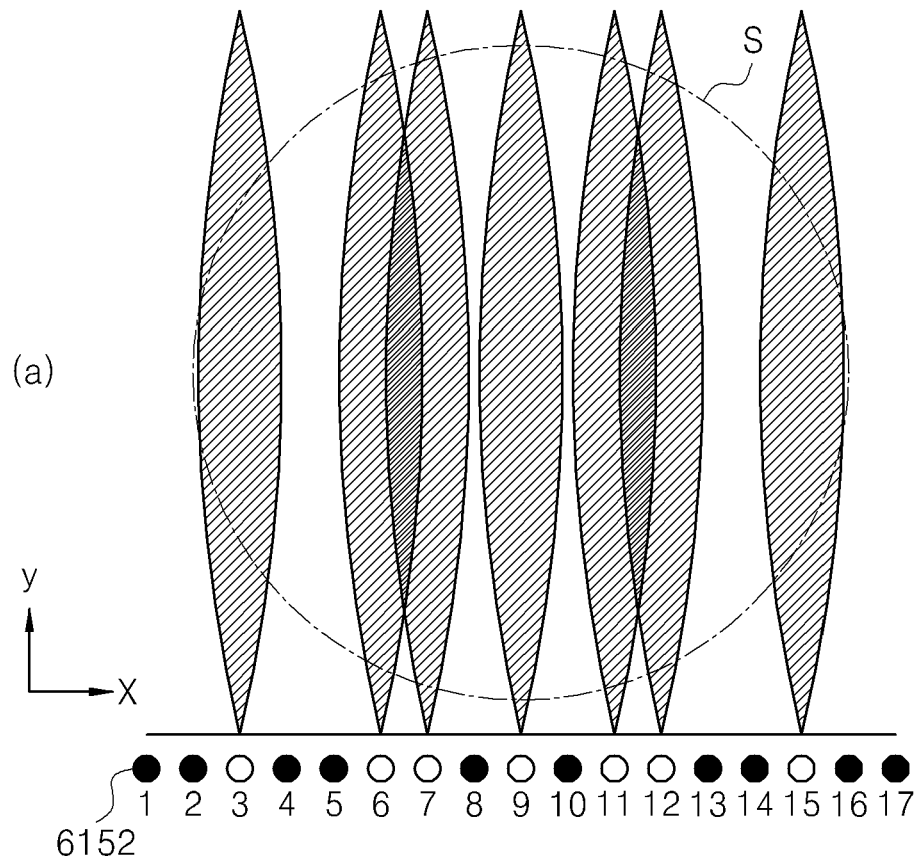
Figure 8:
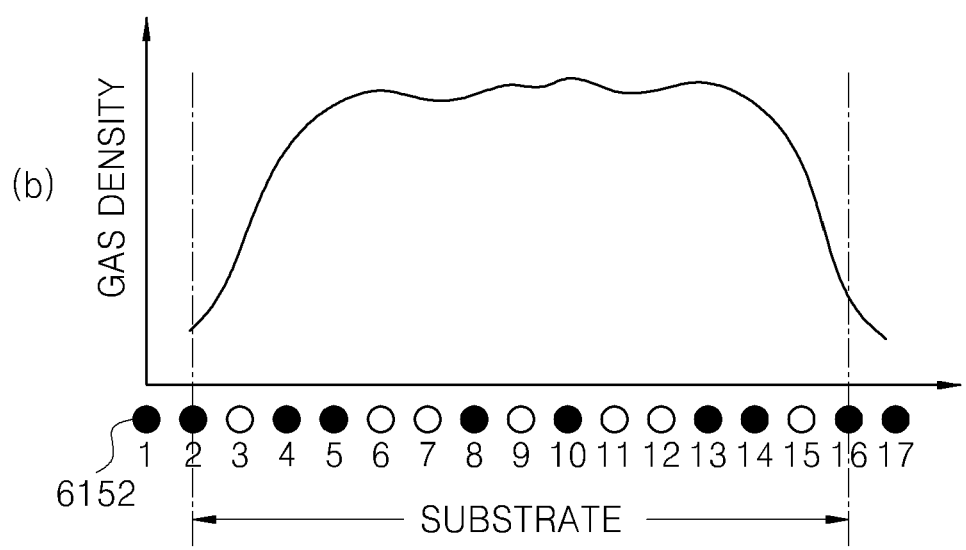

5 is a stereoscopic view illustrating the spray control unit, in accordance with yet still exemplary embodiment. FIG. 6 is a view describing the flow of gas when the gas sprayed from the spray part flows toward an exhaust part. FIGS. 7 and 8 are views schematically illustrating the distribution of gas density according to whether or not each of a plurality of nozzles sprays gas, respectively. FIGS. 9 to 12 are views describing each of the distribution types of gas density according to whether or not each of a plurality of nozzles sprays gas. FIG. 13 is an exemplarily conceptual view illustrating a gas density distribution type storage part and a spray control type storage part.

Hereinafter, a substrate processing facility having a gas spraying apparatus in accordance with an exemplary embodiment will be described with reference to the drawings. In this case, the substrate processing facility in accordance with an exemplary embodiment will be described as an example of so-called rapid thermal process (RTP) in which high-temperature heat is generated and a substrate is rapidly heat-treated by using the generated heat.

Further, the substrate processing facility in accordance with an exemplary embodiment may be a substrate processing facility forming a thin film on the substrate under a low pressure environment of approximately 20 torr or less, more preferably approximately 5 to approximately 10 torr or less.

Referring to FIG. 1, the substrate processing facility in accordance with an exemplary embodiment, that is, a rapid thermal process facility includes: a chamber 100 having an internal space, a seating portion 200 positioned inside the chamber 100 to seat a substrate S which is a subject, a heating unit 300 having a plurality of lamps 320 which is positioned opposite to the seating portion 200 and provides a heat source for heat-treating the substrate S, a gas spray part 6100 having a plurality of nozzles 6152 which are aligned and disposed so as to correspond to the seating portion 200 at an upper side of the substrate S seated on the seating portion 200 in one extension direction of the substrate S to spray gas toward the substrate S, and a gas spraying apparatus having a spray control unit 6200 for controlling the gas sprayed from each of the plurality of nozzles, depending on a gas density distribution type to be performed or targeted in the extension direction of the substrate S, and an exhaust part 500 in which at least some is positioned opposite to the plurality of nozzles inside the chamber 100, and has a pumping force.

The substrate S according to an exemplary embodiment may be a wafer applied to a semiconductor device. Of course, the substrate is not limited thereto, and substrates made of glass, metal, etc. may be variously applied according to an apparatus to be manufactured.

The chamber 100 is in the shape of a container having an internal space in which the substrate S, a subject, may be processed, and is, for example, in the shape of a rectangular container of which cross-section is rectangular. More specifically, the chamber according to an exemplary embodiment has an opening or an opened shape on an upper side thereof, and is sealed by a window 400 and a heating unit 300 to be described later. Also, in the chamber 400, an entrance (not illustrated) through which the substrate S enters or exits is installed, and a robot (not illustrated) for transporting the substrate may be installed.

In the above description, the shape of the chamber 100 is a rectangular container. However, the shape of the chamber 100 is not limited to the rectangular container, and may be changed into various shapes such as circular or polygonal shape having a processing space for the substrate S.

Referring to FIGS. 1 to 3, the seating portion 200 is positioned inside the chamber 100, and is disposed in a lower portion of the chamber 100 in the embodiment. The seating portion 200 according to an embodiment seats one surface of the substrate S thereon, and, at the same time, is formed so as to have a space for allowing the gas sprayed from a gas spray part therein to flow in and move and a space for allowing the gas passing through the substrate S to be exhausted through the exhaust part 500, that is, a gas passage. More specifically, the seating portion 200 according to an embodiment includes a stage seating the substrate S thereon, a cover member 220 spaced apart from the upper side of the stage 210 and covering at least the remaining stage region except for the region seating the substrate, a support 230 positioned between the stage 210 and the cover member 220 and configured to support the cover member 220 such that the cover member 220 is spaced apart from the upper side of the stage 210.

The stage 210 is positioned opposite to the heating unit 300 and seats the substrate S on the upper portion. The stage 210 according to the embodiment has a plate shape in which some of the upper surface thereof has a groove with a height lower than that of the other regions, and the substrate S is seated in the groove, and the region or groove on which the substrate S is seated is referred to as a seating groove 211. Of course, a separate seating groove 211 may not be provided in the stage 210, the upper surface of the stage 210 may be a flat surface, the substrate S may be seated in one region, and this region may be a substrate seating region.

A plurality of lift pins capable of ascending and descending may be disposed on the stage 210, and the plurality of lift pins functions to seat the substrate S on the stage 210, or separate the substrate S from the stage S. The plurality of lift pins are inserted and installed so as to penetrate in the vertical direction, and is configured so as to be movable in the vertical direction.

The cover member 220 may have a hollow plate shape spaced apart from the upper side of the stage 210 and having at least an opening in the region corresponding to the seating groove 211 of the stage 210. Herein, the area of the opening of the cover member 220 is preferable to be larger than that of the seating groove 211.

As described above, the cover member 220 is spaced apart from the upper side of the stage 220 by the support 230, and some of the space disposed between the cover member 220 and the stage 210 is opened, and some is spaced apart so as to be closed by the support 230. In other words, the support 230 is disposed only in a part of space between the cover member 220 and the stage 210 to generate the spaced space between the cover member 220 and the stage 210. More specifically, among the region between the cover member 220 and the stage 210, the positions corresponding to the plurality of spray parts 6150 and the position corresponding to the exhaust part 500 are opened (spaced space), and the support 230 is disposed such that the remaining position may be closed.

Herein, the opening region corresponding to the spray part 6150, which will be described later, among the region between the cover member 220 and the stage 210 becomes a flow passage (hereinafter, a gas supply flow passage 240a) for allowing the gas sprayed from the spray part 6150 to flow in and move in the direction in which the substrate S is positioned, and the opening region in the position corresponding to the exhaust part 500 becomes a flow passage (hereinafter, a gas exhaust flow passage 240b) for exhausting the gas or unreacted material having passed through the substrate S. In this case, it is preferable that the gas supply flow passage 240a and the gas exhaust flow passage 240b are provided to face each other.

At least a part of the exhaust part 500 is positioned inside the chamber 100, and includes an exhaust pipe 510 positioned so as to correspond to the gas exhaust flow passage 240b among one side of the seating portion 200 and an exhaust pump 520 connected to the exhaust pipe 510.

The heating unit 300 according to an embodiment generates light, and is a device for heating the substrate S by using the generated heat. That is, the heating unit 300 includes, as illustrated in FIG. 1, a housing 310 positioned opposite to an upper opening of the chamber 100 and the window 400, and a plurality of lamps 320 spaced apart from one another so as to be aligned in the extension direction of the housing 310.

The housing 310 is installed on the upper side of the chamber 100 so as to close or seal the upper opening of the chamber 100 to protect the chamber 100 from the external environment. Also, in this housing 310, the plurality of lamps 320 are installed so as to space apart from one another. To this end, the housing 310 is provided with the plurality of seating grooves 311 which are opened in the direction toward the window 400 or the seating portion 200 and is capable of accommodating the lamps 320. That is, the housing 310 is provided with the plurality of grooves 311 to be spaced apart from one another, the seating grooves 311 have opened shape in the direction toward the window 400, for example, in the lower side, and the lamps 320 are mounted in the seating groove 311. The seating groove 311 according to an embodiment has, but not limited to, a dome shape in the lower side, and may be changed into various shapes capable of inserting the lamps.

Each of the lamps 320 is a means providing heat for heat-treating the substrate S as described above, and is installed in the plurality of seating grooves 311 provided in the housing 310. Accordingly, the heat generated from the plurality of lamps 320 is transferred to the substrate S through the window 400.

For example, the lamp 320 according to an embodiment includes a lamp body having a filament inside thereof and penetrating radiant heat, a lamp supporter for fixing the lamp body, a lamp socket connected to the lamp supporter to receive external power supply. Herein, the lamp body may be manufactured by using glass or quartz such that radiant heat passes through without loss, and it is effective that the inside of the lamp body is filled with inert gases (e.g., halogen, argon).

The plurality of lamps 320 are spaced apart from one another, and the arrangement or disposition structure thereof may be variously changed according to the shape, size, and the like of the substrate S. Also, the plurality of lamps 320 may be installed not only at the position corresponding to the upper surface of the substrate S, but also at outer surface of the substrate S.

In the above, the heating unit for heat-treating a substrate by using light has been described. However, the embodiment is not limited thereto, and various devices capable of heating the substrate, such as a heating unit of an electric resistance heating type having a coil, may be applied.

The window 400 is disposed so as to close the upper opening of the chamber 100 between the heating unit 300 and the process chamber 100 and passes through thermal energy generated from the plurality lamps 320. At the same time, the window 400 spatially separates the heating unit 300 and the chamber 100, and thus blocks contaminants from entering into the chamber 100 and separates the atmosphere inside the heating unit 300 and the chamber 100. This window 400 may pass through 90% or more of thermal energy, that is, a wavelength energy in approximately 1 to approximately 4 μm, generated from the lamp 320.

The gas sprayed to the substrate S by a gas spraying apparatus 6000 according to an embodiment may be a reaction gas which reacts with the substrate S or a thin film formed on the substrate S to form an oxide film, and the reaction gas may be, for example, a mixture gas of oxygen ($O_2$) and hydrogen ($H_2$).

Hereinafter, in describing the gas spraying apparatus 6000 according to an exemplary embodiment, it will be exemplarily described that the gas spraying apparatus 6000 sprays the mixture gas of oxygen ($O_2$) and hydrogen ($H_2$), that is, the reaction gas, onto the substrate S. However, the gas sprayed by the gas spraying apparatus 6000 is not limited to the above-described oxygen and hydrogen gas and reaction gas (reactive gas), and various gases may be applied depending on the substrate processing purpose or the type of process.

The gas spraying apparatus 6000 according to an embodiment performs controls such that a gas density distribution type in an extension direction of the substrate S may become a targeted gas density distribution type. Herein, the gas density distribution refers to a gas density at each of the positions, in the direction crossing the direction in which the gas sprayed from the spraying part flows to the exhaust direction, or in the direction of the direction crossing the direction in which the plurality of nozzles 6152 are aligned.

Figure 5:
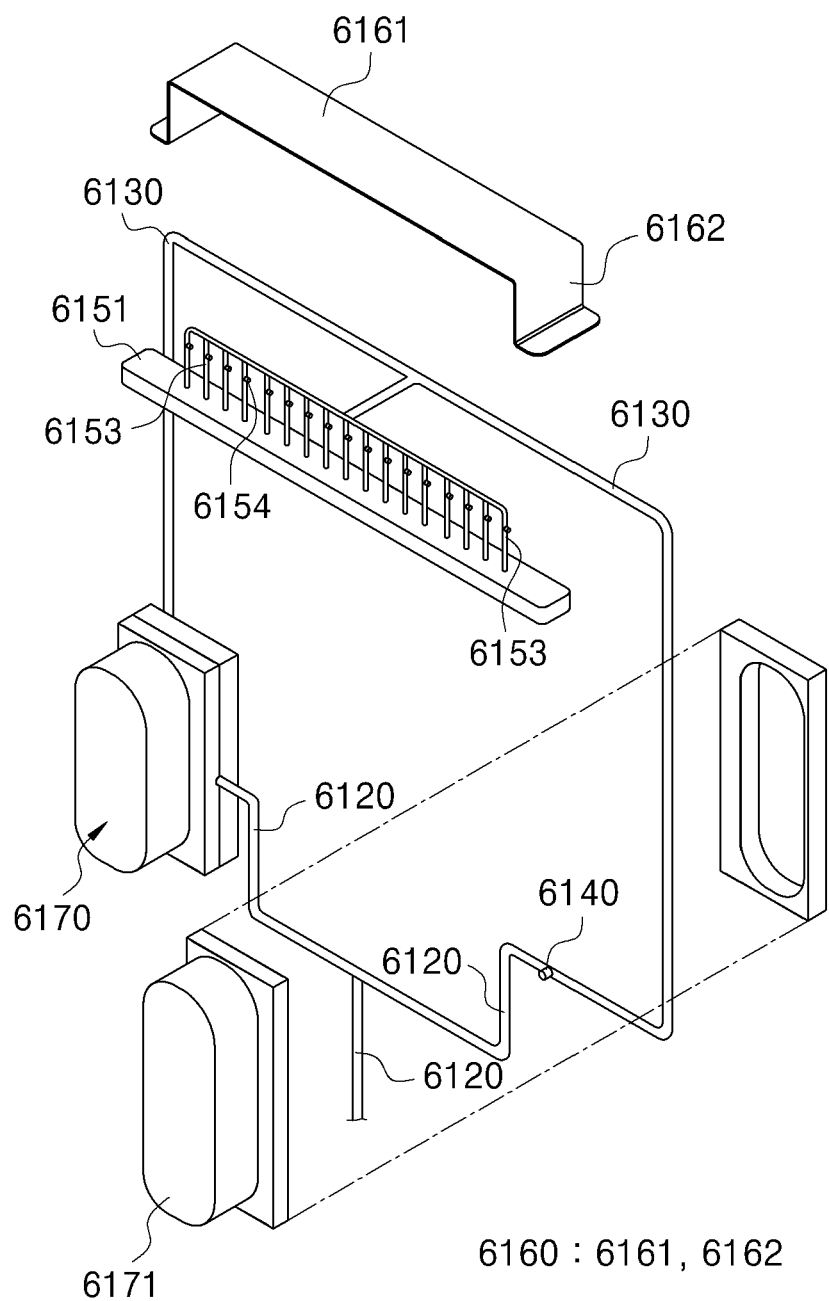
FIG. 5 is a stereoscopic view illustrating the spray control unit, in accordance with yet still exemplary embodiment.

As illustrated in FIGS. 1, 2, 4 and 5, this gas spraying apparatus 6000 includes a gas spray part 6100 aligned and disposed on one side outside the substrate S seated on the seating portion 200 in the direction corresponding to the extension direction of the substrate S and having a spray part 6150 provided so as to be capable of spraying gas in the direction in which the substrate S is positioned, and a spray control unit 6200 configured to control the gas spray of the spray part 6150 according to the gas density distribution type to be performed or targeted Referring to FIG. 2, and FIGS. 4 and 5, the gas spray part 6100 has a plurality of nozzles 6150 aligned and disposed in the width direction of the substrate S, and includes a spray part 6150 positioned on one side outside the substrate S from the upper side of the substrate S seated in the seating portion 200, a gas storage part 6100 for storing the gas to be supplied to the spray part 6150, a main supply part 6120 of which one end is connected to the gas spray 6100, a transport part 6130 of which one end is connected to the main supply part 6120 and the other end is connected to the spray part 6150, a main valve 6140 for controlling the communication between the main supply part 6120 and the transport part 6130, a support part 6160 for supporting the spray part 6150, and a monitoring part 6170 disposed a position of at least any one of the extension paths of the transport part 6130 to monitor the gas outflow from the transport part 6130.

When the gas to be supplied to the spray part 6150 is a gas in which a plurality of kinds of gases are mixed, the mixture gas in which a plurality of kinds of gases are mixed at a predetermined ratio may be stored in the gas storage part 6100. For example, when a mixture gas of oxygen ($O_2$) and hydrogen ($H_2$) is supplied, the mixture gas of oxygen ($O_2$) and hydrogen ($H_2$) may be stored in the gas storage part 6110. Of course, the embodiment is not limited thereto, and a plurality of gas storage parts 6100 are provided depending on the number of the gas to be mixed, and the gas is supplied from each of the gas storage parts 6110 to the main supply part 6120, so that a plurality of kinds of gases may be mixed in the main supply part 6120, and this mixture gas may be supplied to the transport part and the spray part.

The main supply part 6120 is in the shape of a pipe provided with a passage through which gas may move inside, and may be formed such that one end thereof is connected to the gas storage part 6120, and a plurality of transport parts 6110 are branched from the main supply part 6120. Also, a valve is disposed between the gas storage part 6110 and the main supply part 6120 or on the extension path of the main supply part 6120, and thus when the valve is opened, a gas in the gas storage part 6110 is supplied to the main supply part 6120; when the valve is closed, the gas in the gas storage part 6110 is not supplied to the main supply part 6120.

A valve for controlling the communication between the gas storage part 6110 and the main supply part 6120 may be an electronic valve of which the opening and closing are controlled by an electrical signal, for example, a solenoid valve.

The transport part 6130 transports the gas provided from the main supply part 6120 to the spray part 6150, more specifically, to a supply pipe 6153 of the spray part 6150, and may be a pipe provided with a passage through the gas may be move. As illustrated in FIG. 5, such a transport part 6130 is provided in plurality, and each of the one ends is connected to the main supply part 6120, and the other ends are connected to the spray pipe 6153 of the spray part 6150.

The transport part 6130 is provided in plurality as described above, which may be provided with a smaller number than that a supply pipe 62153 to be described later. In order that one transport part 6130 supplies gas to a plurality of gas pipes, the region connected to the supply pipe 6153 may have a shape branched in a plurality of directions. Of course, the transport part 6130 may be provided in a number corresponding to the supply pipes and may be connected in a one-to-one relationship.

For example, as illustrated in FIG. 5, the transport part 6130 may be branched in both directions from the main supply part 6120, and may have a structure in which one transport part 6130 extends to one direction of the seating portion 200 to be connected to a part of a plurality of supply pipes 6153 among a plurality of supply pipes 6153 of the spray part 6130, and the other transport part 6130 extends to the other direction to be connected to the remaining of a plurality of supply pipes 6153.

In this case, the connection structure between the transport part 6130 and the supply pipe 6153 is not limited to the above-described example, and any connection structure capable of transporting the gas to each of the plurality of supply pipes 6153 or nozzles 6152 may be employed.

Of course, the connection structure of the transport part 6130 with the plurality of supply pipes 6153 is not limited to the above-described structure, and the structural design capable of supplying gas to the plurality of supply pipes 6153 may be variously changed.

The main valve 6140 is a valve for controlling the communication between the main supply part 6120 and the transport part 6130, which may be disposed on the connection portion between the transport parts 6130 branched from the main supply part 6120 or on the extension paths of each transport part 6130. This main valve 6140 may be an electronic valve of which the opening and closing are controlled by an electrical signal, for example, a solenoid valve.

As illustrated in FIGS. 2 and 3, a spray part 6150 is positioned outside of the side of a substrate S seated on a seating portion 200 and is formed by extending to one width direction of the substrate S, and includes a spray block 6151 in which a plurality of nozzles 6152 capable of spraying gas are aligned and spaced apart from one another in the extension direction, supply pipes 6153 in which one ends are connected with transport parts 6130 and the other ends are connected with nozzles 6152 provided on a spray block 6151, and spray valves 6154 disposed on the extension paths of supply pipes 6153 to control the communication between supply pipes 6153 and nozzles 6152.

The spray block 6151 is formed by extending to the width direction of the substrate S to be positioned on the one side outside a cover member 220 on the upper side of a stage 210, and is disposed such that the lower potion is spaced apart from the stage 210. Accordingly, the space spaced between the spray block 6151 and the stage 210 is communicated with a gas supply flow passage, which is the space spaced between the cover member 220 and the stage 210.

As illustrated in FIG. 4, the spray block 6151 includes a plurality of nozzles 6152 penetrating the spray block 6151 in the vertical direction and opened at one end and the other end thereof to spray gas toward the substrate S, and the plurality of nozzles 6152 are aligned and spaced apart from one another in the extension direction of the spray block 6151 or in one width direction of the substrate S. Herein, the gas provided from supply pipes 6153 enteres into one end opening of the nozzles 6152, and then is discharged from the other end opening. In this case, the other opening of the nozzles 6152 is preferably provided so as to be positioned on the lower side of the cover member 220.

When the plurality of nozzles 6152 are aligned and disposed in the width direction of the substrate S, the aligned length of the plurality of nozzles 6152 is preferable to be equal to or larger than a wafer diameter. When the aligned length of the plurality of nozzles 6152 is larger than the wafer diameter, the nozzles 6152 positioned at both ends are positioned at the outside of the substrate S. For example, when the substrate S is a circular wafer, the plurality of nozzles 6152 are aligned and disposed in the diameter direction of the substrate S, the aligned length of the plurality of nozzles 6152 is preferable to be equal to or larger than the diameter of the wafer. Also, it is preferable that the position of a nozzle 6152 positioned in the center among the aligned plurality of nozzles 6152 is disposed so as to correspond to the center in the diameter direction of the substrate S.

The supply pipe 6153 is a way for supplying gas transported from the transport part 6130, and may be in the shape of a pipe with an internal space. The supply pipe 6153 is provide in plurality so as to correspond to a plurality of nozzles 6152, and one end thereof is connected to the transport part 6130, and the other end thereof is connected to the nozzle 6152, respectively. Also, the supply pipe 6152 is disposed such that the other end thereof is inserted into the inside of the nozzle 6152 or communicates with one end opening of the nozzle at the upper side of the spray block 6151.

The spray valve 6154 controls the communication between the supply pipe 6153 and the nozzle 6152, and may be disposed on a connection portion between the transport part 6130 and the supply pipe 6153, or on the extension path of the supply pipe. The spray valve 6154 may be an electronic valve of which the opening and closing are controlled by an electrical signal, for example, a solenoid valve.

According to the gas spray part 6100 as described above, the gas supplied from the main supply part 6120 is sprayed by being transported to each of the plurality of nozzles 6152 through the main supply part 6120, the plurality of transport parts 6130, and the plurality of supply pipes. Also, the gas sprayed from the plurality of nozzles 6152 is discharged to the space spaced between the spray block 6151 and the stage 210, and then is transported through a gas supply flow passage 240a, which is a space spaced apart from one side between the cover member 220 and the stage 210, in the direction in which the substrate S is positioned, and this gas reacts with the substrate S or a thin film formed on the substrate S while flowing in the direction in which the exhaust part 500 is positioned. For example, when the substrate S is a silicon wafer, and the gas is a mixture gas of oxygen ($O_2$) and hydrogen ($H_2$), a $SiO_x$-type silicon oxide film may be formed. Further, the unreacted gas which does not react with the substrate S, or a reaction by-product is exhausted through a gas exhaust flow passage 240b, which is a space spaced apart from the other side between the cover member 220 and the stage 210.

The monitoring part 6170 monitors whether or not the gas is outflowed from the transport part 6130. As illustrated in FIG. 1, FIG. 2 and FIG. 5, the monitoring part 6130 includes a case 6171 covering at least a part of the extension paths of the transport part 6130, and a sensor 6172 mounted on the case 6171 to monitor whether or not the gas is outflowed from the transport part 6130 which is positioned inside the case 6171.

The case 6171 may be disposed so as to cover the transport part 6130 in the extension path of the transport part 6130, for example, at a position adjacent to the main valve 6140, and may be disposed so as to accommodate the plurality of transport parts 6130.

The sensor 6172 monitors whether or not the gas is leaked from the plurality of transport parts 6130 accommodated in the case 6171 to the inside of the case 6171, and may be disposed outside the case 6171 so as to communicate with the inside of the case 6171.

The sensor 6172 according to the embodiment employs an electrochemical method, an optical method, an electrical method, and the like in accordance with a detection method. For example, there are various methods such as a method of detecting a pressure change in a case when a gas flows out. The sensor 6172 can be variously applied according to the type, concentration, and detection method of the detectable gas.

In the above description, the monitoring part 6170 is disposed, but not limited to, at a position adjacent to the main valve 6140 in the extension path of the transport part 6130, and the monitoring part 6170 may be disposed anywhere in the extension path of each of the plurality of transport parts 6130.

The support part 6160 is positioned on the upper side of the spray block 6151, and supports the plurality of transport parts and the plurality of supply pipes. The support part 6160 according to the embodiment includes a first support member 6161 extending from the upper side of the spray block 6151 in a direction corresponding to the spray block 6151 and a pair of second support members 6162 each connected to both ends of the first support member 6161 and formed by extending in the direction in which the spray block 6151 is positioned. The support part 6160 is provided with a space between the first and second support members 6161 and 6162 by the connection structure of the first and second support members 6161 and 6162.

Further, a plurality of supply pipes 6153 are aligned and disposed inside the support part 6160 so as to correspond to the direction in which the plurality of nozzles 6152 are aligned, and the transport part 6130 extends from the main supply part 6120 to the upper side of the spray block 6151 and is connected to the supply pipes 6153 disposed inside the support part 6160.

On the other hand, the gas sprayed through the spray part 6150 flows to the upper side of the upper surface of the substrate S, which is a treatment surface, and flows from the spray part 6150 in the direction in which the exhaust part 500 is positioned. In this case, when the gas discharged from one nozzle 6152 flows in the direction of the exhaust part 500, the nozzle 6152 does not flow so as to have a constant width or area from the nozzle 6152 in the direction in which the exhaust part 500 is positioned, and the width or area thereof is usually not constant but flows while changing. For example, the gas discharged from one nozzle 6152 gradually diffuses toward the substrate S and the area thereof becomes wider, and the gas may flow such that the area becomes narrower toward the direction in which the exhaust part 500 is positioned (see FIGS. 6, 7 and 8).

The change in the flow, width, or area of the gas may be caused by a change in pressure inside the chamber, more specifically, a change in pressure from the spray part 6150 to the direction of the exhaust part.

In addition, the plurality of nozzles 6152 are aligned and disposed in one direction, and thus the flow or diffusion area of the gas discharged from each nozzle 6152 is influenced by the gas sprayed from the nozzle 6152 at the adjacent position (See FIGS. 6 to 8). In other words, while the gas sprayed from one nozzle 6152 flows in the direction of the exhaust part 500, the flow or diffusion area of the gas discharged from the one nozzle 6152 is different depending on the amount of gas discharged when the gas is discharged from the other nozzle 6152 positioned adjacent thereto and the amount of gas discharged when the gas is not discharged. Also, the gas flow or diffusion area is different depending on the distance between the one nozzle 6152 and the other nozzle 6152 when the gas is discharged from the other nozzle 6152 other than the one nozzle 6152 and the number of nozzles 6152 to be discharged when the gas is discharged from the plurality of nozzles 6152.

As described above, the gas flow and the diffusion area change depending on the position of the nozzle 6152 to be discharged among the plurality of nozzles 6152 aligned in the extension direction of the substrate S, the number of the nozzles 6152 for discharging the gas, the distance spaced between the nozzles 6152 to be discharged, the amount of gas to be discharged, and the like. Therefore, as shown in FIGS. 7A and 8B, the density of the gas varies depending on the position thereof in the region corresponding to the substrate S on the upper side of the substrate S.

In other words, the gas density may be the same or different depending on the position in the width direction of the substrate S. More specifically, when the direction in which the plurality of nozzles 6152 are aligned is referred to as the X axis direction and the direction in which the gas flows from the nozzle 6152 in the direction in which the exhaust part 500 is positioned is referred to as the Y axis direction, the gas densities may be the same or different along the X-axis position at one position in the Y-axis direction from the upper side.

In this case, the direction in which the plurality of nozzles 6152 are aligned is the width direction of the substrate S, and thus the width direction of the substrate S is the X axis direction. Therefore, the gas density variation in the substrate width direction (X axis direction) may be regarded as the gas density distribution in the extension direction of the width direction of the substrate, and the gas density distribution may vary depending on the position of the nozzle

6152 to be discharged, the number of the nozzles 6152 for discharging the gas, the distance spaced between the nozzles 6152 to be discharged, the amount of gas to be discharged, and the like.

For example, as shown in FIG. 7B, the gas density at both edges in the width direction (X-axis direction) of the substrate S and the gas density at the center portion of the substrate S are higher than those in the other regions, and the gas densities of the other regions except for both edges and the center portion may show similar gas density distributions.

As another example, as illustrated in FIG. 8B, the gas density increases as going from both edges to the center position in the width direction (X-axis direction) of the substrate S, and the gas density at both edges may be exhibited the lowest gas density distribution relative to the other region.

The gas density distribution as illustrated in FIG. 7B and the gas density distribution as illustrated in FIG. 8B are adjusted depending on the position of the nozzle 6152 for discharging (or spraying) the gas among the plurality of nozzles 6152 aligned in the X-axis direction, the distance from the adjacent nozzle 6152 for discharging the gas, the number of nozzles 6152 for spraying the gas, the amount of gas discharged, and the like. That is, in order to form the gas density distribution as illustrated in FIGS. 7B and 8B, among the plurality of nozzles 6152 aligned in one direction, the gas is sprayed through a part of the nozzles 6152 as illustrated in FIGS. 7A and 8A, and no gas is sprayed from other nozzles.

As described above, the gas density distribution form with respect to the substrate S varies depending on whether or not the gas is sprayed from each of the plurality of nozzles 6152 and the amount of discharged gas. Hereinafter, the gas density distribution form of the different types is referred to as the gas density distribution type.

In the substrate processing process, the process type for the substrate S is determined according to the target product to be manufactured, the equipment environment, the type of the substrate S and the like, and there is a gas density distribution type suitable for carrying out this process. For example, when a thin film is to be formed on the substrate S and a uniform thickness is to be formed in the entire region of the substrate, the gas density distribution type as shown in FIG. 6B should be used. As another example, in order to ensure such that the thickness of the thin film deposited on the central region of the substrate is higher than the edge, it should be a gas density distribution type as shown in FIG. 8B.

In order to form one gas density distribution type, whether or not gas is sprayed from each of the plurality of nozzles 6152 is determined, which is called a spray control type. That is, there is one spray control type for performing or forming one gas density distribution type, and the one spray control type has information on whether the spray of each of the plurality of nozzles 6152 aligned in one direction. Further, the one spray control type may have gas discharge amount information in each of the plurality of nozzles 6152.

Hereinafter, the gas density distribution type according to the spray control type will be described with reference to FIGS. 9 to 12. In this case, a total of seventeen nozzles 6152 are aligned and disposed in the width direction of the substrate S, and the first to seventeenth nozzles are named from left to right. In FIGS. 8 to 14, reference numerals 1 to 17 denote first to seventeenth nozzles by numbering, wherein denotes that '1' is a first nozzle 6152, '2' is a second nozzle 6152, '3' is a third nozzle 6152, '4' is a fourth nozzle 6152, '5' is a fifth nozzle 6152, '6' is a sixth nozzle 6152, '7' is a seventh nozzle 6152, '8' is an eighth nozzle 6152, '9' is a ninth nozzle 6152, '10' is a tenth nozzle 6152, '11' is an 11th nozzle 6152, '12' is a 12th nozzle 6152, '13' is a 13th nozzle 6152, '14' is a 14th nozzle 6152, '15' is a 15*t* nozzle 6152, '16' is a 16th nozzle 6152, and '17' is a 17th nozzle 6152.

In addition, the first nozzle 6152 located at the outermost one of the first to seventeenth nozzles 6152 and the seventeenth nozzle 6152 located at the outermost one of the other outermost sides are disposed on one side and the other side. Accordingly, the first and seventeenth nozzles 6152 may not face the substrate S. Also, the second through sixteenth nozzles 6152 are located between the first nozzle 6152 and the seventeenth nozzle 6152, and are aligned so as to face the substrate S. Further, among the first to seventeenth nozzles 6152, the ninth nozzle 6152 is located at a position corresponding to the center in the width direction of the substrate S, and the first to seventeenth nozzles 6152 are equally spaced or irregular.

In the plurality of nozzles 6152 disposed under the same conditions as described above, the gas density distribution type is varied, for example, as shown in FIGS. 9 to 12 according to controlling whether or not the gas is sprayed from each nozzle 6152.

Figure 9:
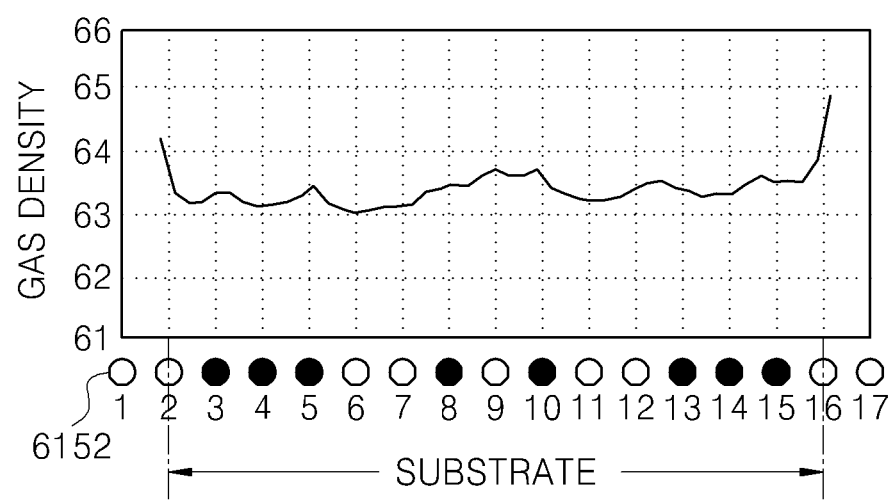
FIGS. 9 to 12 are views describing each of the distribution types of gas density according to whether or not each of a plurality of nozzles sprays gas.

First, as shown in FIG. 9, the gas is discharged from the first and seventeenth nozzles 6152 located at the outermost positions, the second and sixteenth nozzles 6152 disposed closest to the first and seventeenth nozzles 6152, the ninth nozzle 6152 located at the center of the ninth nozzle 6152, the sixth and seventh nozzles 6152 located in the leftward direction of the ninth nozzle 6152, the eleventh and twelfth nozzles 6152 located in the rightward direction of the ninth nozzle 6152. Also, no gas is discharged from the remaining spray part, such as the first nozzle 6152, the third to fifth nozzles 6152, the eighth nozzle 6152, the tenth nozzle 6152, the thirteenth to fifteenth nozzles 6152, and the seventeenth nozzle 6152. As shown in FIG. 9, in the case of this spray control type, it is appeared a distribution type having gas densities mutually similar to the entire region in the substrate width direction of the substrate S.

Figure 10:
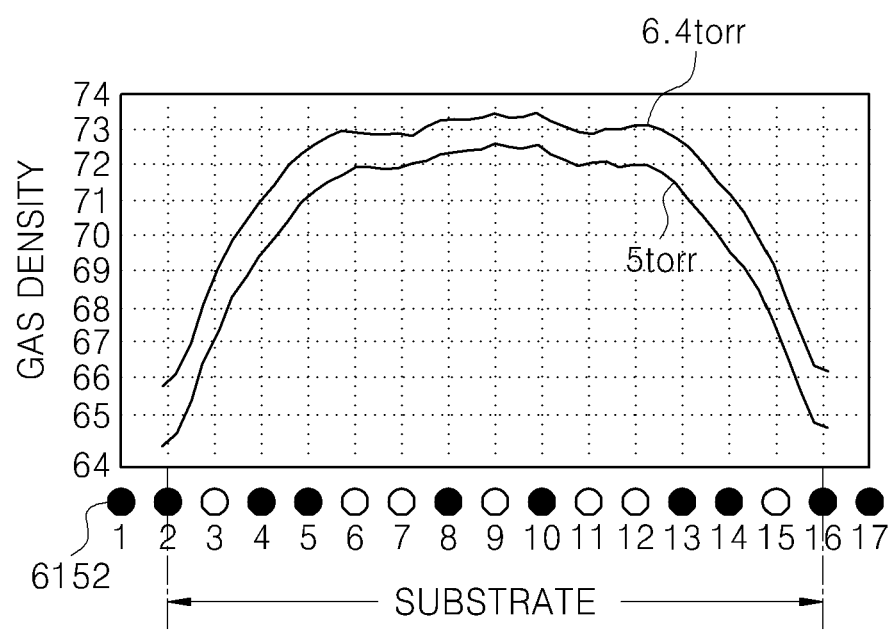

As another example, as shown in FIG. 10, the gas is sprayed from the third and fifteenth nozzles 6152, the sixth and seventh nozzles 6152, the eleventh and twelfth nozzles 6152, and the fifteen nozzles 6152, and no gas is sprayed from the remaining nozzles such as the first and second nozzles 6152, the fourth and fifth nozzles 6152, the eighth to tenth nozzles 6152, the thirteenth and fourteenth nozzles 6152, and the sixteenth and seventeenth nozzles 6152. In the case of this spray control type, as illustrated in FIG. 10, the gas density at both edges of the substrate S is lowest, the gas density at the center of the substrate S is the highest, and the gas density tends to increase toward the center of the substrate S from both edges of the substrate S, and the gas density in the central portion of the substrate S and in the surrounding thereof shows a gas density distribution type similar to each other.

In this case, the gas density distribution type does not change according to the pressure inside the chamber 100, but the gas density in each region changes. That is, as shown in FIG. 10, the gas density at each position is higher than when the pressure inside the chamber 100 is relatively high (e.g., 6.4 torr) or when the pressure is low (5 torr).

Figure 11:
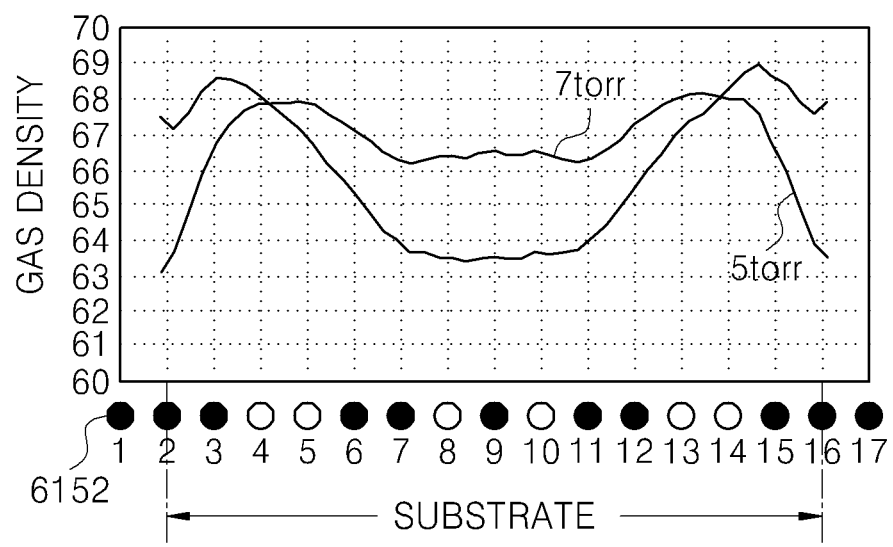

As another example, as shown in FIG. 11, the gas is sprayed from the fourth and fifth nozzles 6152, the eighth nozzle 6152, the tenth nozzle 6152, the thirteenth and fifteenth nozzles 6152, and no gas is sprayed from the remaining nozzles 6152, such as the first to third nozzles 6152, the sixth and seventh nozzles 6152, the ninth nozzle 6152, the eleventh and twelfth nozzles 6152, and the fifteenth to seventeenth nozzles 6152. In the case of this injection control type, as shown in FIG. 11, it is appeared a gas density distribution type in which the gas density tends to increase from the center of the substrate toward both edge directions.

In this case, depending on the pressure inside the chamber 100, there is no significant change in the gas density distribution type or density change tendency, but the gas density in each region is changed. For example, when the pressure inside the chamber 100 is relatively high at 7 torr and the pressure inside the chamber 100 is relatively low at 5 torr, the tendency of the gas density to increase from the center of the substrate toward the edge direction is similar. However, when the pressure is 7 torr, the gas density is the highest at the substrate position corresponding to the third and the sixteenth nozzles 6152; when the pressure is 5 torr, the gas density is the highest at the substrate position corresponding to the fourth and fifth nozzles 6152, and to the thirteenth and the fourteenth nozzles 6152.

Figure 12:
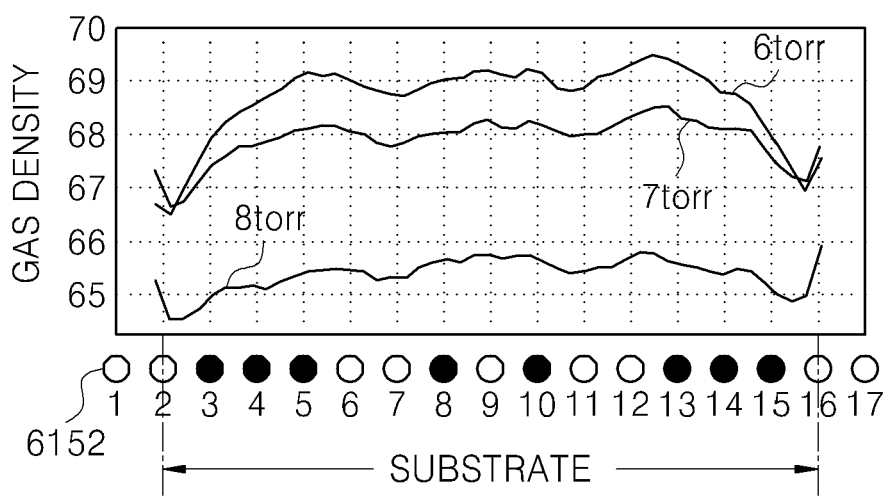
Figure 13:
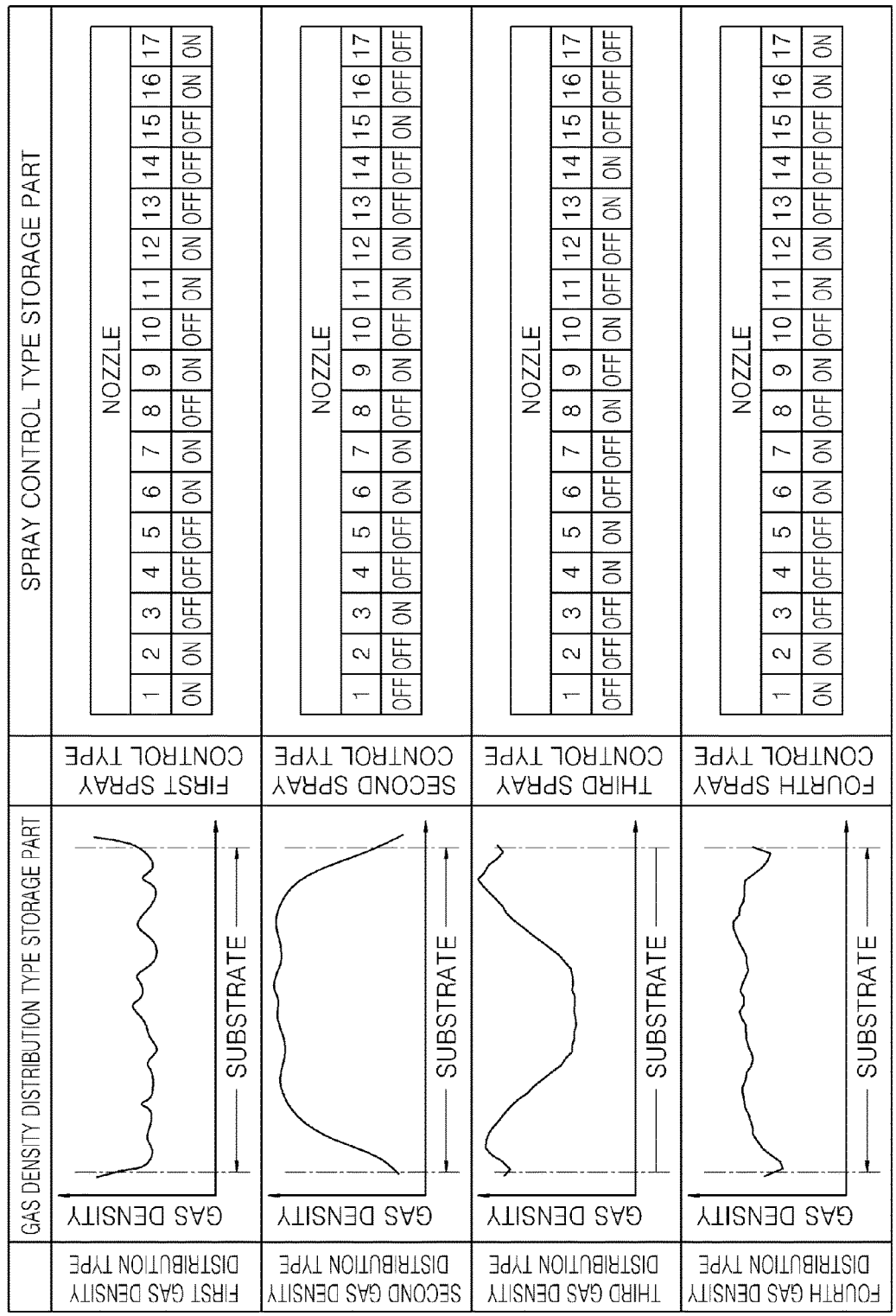
FIG. 13 is an exemplarily conceptual view illustrating a gas density distribution type storage part and a spray control type storage part of a spray control unit according to an exemplary embodiment.

As another example, as shown in FIG. 12, the gas is sprayed from the second nozzle 6152, the sixth and seventh nozzles 6152, the ninth nozzle 6152, the eleventh and twelfth nozzles 6152, the sixteenth nozzle 6152, and no gas is sprayed from the remaining nozzles 6152 such as the first nozzle 6152, the third to fifth nozzles 6152, the eighth nozzle 6152, the tenth nozzle 6152, the thirteenth to fifteenth nozzles 6152, and the sixteenth nozzle 6152. In the case of this spray control type, as shown in FIG. 12, it is appeared a gas density distribution type in which the gas density tends to increase from the center of the substrate toward both edge directions. In this case, the higher the pressure inside the chamber 100, the higher the gas density at each position.

As described above, each of the gas density distribution types illustrated in FIGS. 9 to 12 is different depending on whether or not each of the plurality of nozzles 6152 is sprayed. In other words, in order to obtain a gas density distribution type in which the actual gas density distribution is targeted at the upper side of the substrate S in the actual process, it is determined whether or not each of the plurality of nozzles 6152 for performing the target gas density distribution type are sprayed. Herein, whether or not each of the plurality of nozzles for forming one gas density distribution type are sprayed becomes a spray control type for forming the one gas density distribution type.

For example, in order to realize the gas density distribution type as illustrated in FIG. 9, it is required that the gas is sprayed from the first and seventeenth nozzles 6152, the second and the sixteenth nozzles 6152, the ninth nozzle positioned in the center, the sixth and seventh nozzles 6152 positioned in the leftward direction of the ninth nozzle 6152 and the eleventh and twelfth nozzles 6152 positioned in the rightward direction of the ninth nozzle 6152, and no gas is sprayed from the remaining nozzles.

As another example, in order to realize the gas density distribution type as shown in FIG. 10, it is required that the gas is sprayed from the third and fifteenth nozzles 6152, the sixth and seventh nozzles 6152, the eleventh and twelfth nozzles 6152, and the fifteenth nozzle 6152, and no gas is sprayed from the remaining nozzles.

Further, in order to realize a gas density distribution type as shown in FIG. 11, it is required that the gas is sprayed from the fourth and fifth nozzles 6152, the eighth nozzle 6152, the tenth nozzle 6152, and the thirteenth and fifteenth nozzles 6152, and no gas is sprayed from the remaining nozzles.

As another example, in order to realize the gas density distribution type as shown in FIG. 12, it is required that the gas is sprayed from the second nozzle 6152, the sixth and seventh nozzles 6152, the ninth nozzle 6152, the eleventh and twelfth nozzles 6152, and the sixteenth nozzle 6152, and no gas is sprayed from the remaining nozzles.

In the above description, 17 nozzles 6152 have been described. However, the embodiment is not limited thereto, and it is possible to use a plurality of nozzles having less than 17 nozzles and more than 17 nozzles.

In the gas spraying apparatus according to an exemplary embodiment, the spray control type is controlled by the gas spray control in the plurality of nozzles 6152 as described above, so that a gas density distribution type to be performed or targeted is allowed to be formed in the actual process. To this end, the gas spraying apparatus of an exemplary embodiment includes a spray control unit 6200 interlocked with the gas spray part 6100, and thus determines the spray control type of the spray part 6150 so as to become a target gas density distribution type in the actual process.

Referring to FIG. 4, the spray control unit 6200 according to an exemplary embodiment includes a gas density distribution type storage part 6210 storing a plurality of gas density distribution types for performing each of a plurality of substrate processes, an spray control type storage part 6220 storing a plurality of spray control types for performing each of the plurality of gas density distribution types, a spray control part 6230, in which one of the gas density distribution types is selected according to the substrate process to be performed in the gas density distribution type storage part 6210, one spray control type capable of performing the gas density distribution type is selected in the spray control type storage part 6220, and the operation of the spray part 6150 is controlled and thus controls to allow the spray control type selecting the spray part 6150 to become.

In this case, a plurality of gas density distribution types may be stored in the gas density distribution type storage part 6210 according to the pressure conditions inside the chamber 100, and each spray control type capable of implementing the plurality of gas density distribution types thereof may be stored in the spray control type storage part 6220.

That is, a plurality of gas density distribution types corresponding to a plurality of pressure conditions may be stored in the gas density distribution type storage part 6210, and each spray control type capable of implementing the plurality of gas density distribution types thereof may be stored in the spray control type storage part 6220 may be stored in the spray control type storage part 6220.

Herein, the spray control type for each of the plurality of gas density distribution types may be realized through repetitive experiments for performing each gas density distribution type when equipment is manufactured or set.

The gas density distribution type storage part 6210 stores first to fourth gas density distribution types, for example, as shown in FIG. The spray control type storage part stores the first to fourth spray control types of the spray part 6150 which may realize each of the first to fourth gas density distribution types as illustrated in FIG. 12.

For example, the spray control part 6230 interlocks each of a plurality of gas density distribution types and a plurality of spray control types stored in each of the gas density distribution type storage part 6220 and the spray control type storage part 6220 as shown in FIG. 12, and thus controls the operation of the spray part. That is, the spray control part 6230 controls whether or not the gas is sprayed from each of the plurality of nozzles 6152 and the amount of gas. For this purpose, the spray control part 6230 is signally interlocked with a plurality of spray valves 6154, and thus may signally control the plurality of spray valves 6154. Of course, the spray control part 6230 is signally interlocked with the plurality of main valves 6140, not with the spray valve 6154, to signally control the plurality of main valves 6140, so that the gas spray in each of the plurality of nozzles 6152 may be controlled.

In the above description, four gas density distribution types are stored in the gas density distribution type storage part 6210, and four spray control types are stored in the spray control type storage part 6220. However, the embodiment is not limited thereto, and four or more different gas density distribution types may be stored in the gas density distribution type storage part 6210, and four or more spray control types may be stored in the spray control type storage section 6220.

Hereinafter, a method for processing a substrate using a substrate processing apparatus according to an exemplary embodiment will be described with reference to FIGS. 1 to 13. FIG. In this case, the formation of a silicon oxide film on the substrate S will be described as an example.

First, the substrate S, for example, a silicon wafer is placed in the seating groove of the stage 210. Then, while the lamp 320 of the heating unit 300 is operated to heat the substrate S to 700° C. to 1000° C., the gas spraying apparatus 6000 is operated to spray oxygen ($O_2$) and hydrogen ($H_2$) gas toward the substrate S.

In this case, the substrate processing facility 6000 sprays by adjusting to allow the gas density distribution on the upper side of the substrate S to become a desired type according to the type of the current substrate processing process. For example, for the sake of process to be performed in this process, in the case of becoming a second gas density distribution type in which a gas density at the central portion in the width direction of the substrate is larger than the edge, the gas density at the central portion except for the edge is similar or the same, and the gas density decreases from the edge toward the outermost, the spray control part 6230 selects the second gas density distribution type in the gas density distribution type storage part. Thereafter, the spray control part 6230 automatically selects a second spray control type capable of realizing the second gas density distribution type in the spray control type storage part 6220, and then the spray part 6150 controls so as to be the second spray control type. That is, the spray control part 6230 allows the gas to be sprayed from the first through seventeenth nozzles 6152, the third and fifteenth nozzles 6152, the sixth and seventh nozzles 6152, the eleventh and twelfth nozzles 6152, and the fifteenth nozzle 6152, and allows no gas to be sprayed from the remaining nozzles.

When the gas is sprayed from the third and fifteenth nozzles 6152, the sixth and seventh nozzles 6152, the eleventh and twelfth nozzles 6152 and the fifteenth nozzle 6152, the gas is transported in the substrate direction through a space spaced between the spray block 6151 and the stage 210 and a space spaced between the cover member 220 and the stage 210, and is transported in the direction in which the exhaust part 500 is positioned while passing through on the upper side of the substrate.

Herein, the gas is a mixture gas of oxygen ($O_2$) and hydrogen ($H_2$), and the mixture gas reacts with the substrate, and the gas also reacts with the substrate, a silicon wafer, while passing through on the upper side of the substrate to form a silicon oxide film of $SiO_x$. Also, while the reaction between the substrate S and the gas is performed in this manner, the gas density distribution in the substrate width direction on the upper side of the substrate is in the second gas density distribution type state induced by the spray control unit. Thus, $SiO_x$ may be formed on a substrate in a desired process type.

The unreacted gas which have not reacted with the substrate S, or the reaction by-product is exhausted to the outside through the exhaust part 500.

As described above, in the embodiment, it is easy to control the gas density distribution according to the substrate process to be performed through the spray control unit 6200. That is, the operator may control the operation of the plurality of nozzles 6152 so as to achieve the desired gas density distribution type automatically without controlling whether or not the gas is sprayed from each of the plurality of nozzles 6152 according to the type of the substrate process to be performed. Therefore, the process is easily performed with a plurality of process types or multiple gas density distribution types, and the time for adjusting the open or close operation of the plurality of nozzles 6152 is shortened to improve the productivity, and there is an advantage that the spray control unit 6200 may be used universally so as to cope with various kinds of process conditions.

In accordance with an exemplary embodiment, it is easy to carry out the process with a plurality of process types or a plurality of gas density distribution types, and a time for adjusting the open or close operation of a plurality of nozzles may be shortened. As a result, there is an advantage capable of improving the production rate, and being used universally to be able to cope with various kinds of process conditions.

Although the GAS SPRAYING APPARATUS, SUBSTRATE PROCESSING FACILITY INCLUDING THE SAME, AND METHOD FOR PROCESSING SUBSTRATE USING SUBSTRATE PROCESSING FACILITY have been described with reference to the specific embodiments, they are not limited thereto. Therefore, it will be readily understood by those skilled in the art that various modifications and changes can be made thereto without depart from the spirit and scope of the present invention defined by the appended claims.

What is claimed is:

1. A substrate processing facility, comprising:
 a chamber having an inner space;
 a seating portion disposed in the inner space of the chamber and configured to seat a substrate on one surface thereof;
 a heating unit positioned to face the seating portion and configured to provide heat for heating the substrate; and
 a gas spraying apparatus, which is disposed over an upper surface of the seating portion, is installed so as to be positioned on one side outside the substrate seated on the seating portion, has a plurality of nozzles to spray gas toward the substrate, and automatically controls at least one of whether or not the gas is sprayed from each of the plurality of the nozzles and a gas spray amount of each at the plurality of nozzles such that a gas density distribution in a width direction of the substrate by the gas sprayed through the plurality of nozzles becomes a targeted gas density distribution type among a plurality of gas density distribution types
 wherein the gas spraying apparatus comprises:
  a spray part installed in the inner space of the chamber and comprising the plurality of nozzles and a plurality of valves connected to the plurality of nozzles, respectively, wherein the spray part is configured to control at least one of whether or not the gas is sprayed from each of the plurality of nozzles and a gas spray amount of each of the plurality of nozzles;

a process type storage part configured to store a plurality of different process types;

a gas density distribution type storage part configured to store different gas density distribution types, wherein the different gas density distribution types are configured to realize the plurality of different process types stored in the process type storage part, respectively;

a spray type storage part configured to store a plurality of spray control types, wherein the plurality of spray control types is configured to realize the plurality of gas density distribution types, respectively; and a spray control part configured to:
  select one process type in the process type storage part;
  select one gas density distribution type in the gas density distribution type storage part to realize the selected process type;
  select one spray control type in the spray type storage part to realize the selected gas density distribution type; and
  control an operation of the spray part so that the spray part is controlled according to the selected spray control type, wherein the seating portion comprises:
  a stage having a top surface, wherein the stage is configured to seat the substrate on the top surface thereof; and
  a cover member spaced upward from the stage and having an opening configured to expose the substrate seated on the stage, wherein the spray part extends in a width direction of the substrate and has the plurality of nozzles therein, wherein the spray part is disposed at one side of the cover member above the stage, and wherein the spray part comprises a spray block spaced apart from the stage, wherein a first spacing space between one side of the stage and the cover member is a gas supply passage through which the gas sprayed from the spray part is supplied in the direction in which the substrate is positioned, and wherein a second spacing space between the spray block and the stage communicates with the gas supply passage.

2. The substrate processing facility of claim 1, wherein the spray part comprises:
  a plurality of supply pipes connected to each of the plurality of nozzles to supply gas to each of the plurality of nozzles,
wherein
  a plurality of spray valves are mounted on the plurality of supply pipes, respectively, and
  the spray control part interlocks with the spray valves to control the operation of each of the plurality of spray valves according to the selected spray control type.

3. The substrate processing facility of claim 2, further comprising:
  a transport part configured to transport the gas to each of the plurality of supply pipes;
  a case mounted so as to accommodate at least a part of the transport part in at least one position of an extension path of the transport part;
  a sensor mounted on the case to sense the gas inside the case, and thus monitors a gas leakage from the transport part.

4. The substrate processing facility of claim 2, wherein the seating portion comprises:
  an exhaust part which is disposed so as to face the spray block on the other side outside the seating portion and exhausts gas is installed;
  a spacing space between the stage in the other side and the cover member is a gas exhaust passage through which the gas passing through an upper side of the substrate is exhausted in the direction in which the exhaust part is positioned.

5. The substrate processing facility of claim 1, wherein the heating unit comprises a plurality of lamps aligned and disposed on an upper side of the seating portion in at least one direction so as to face the seating portion, and emitting light.

6. The substrate processing facility of claim 5, wherein the heating unit comprises a window positioned between the plurality of lamps and the seating portion.

* * * * *